US007722376B2

(12) United States Patent
Kobayashi

(10) Patent No.: US 7,722,376 B2
(45) Date of Patent: May 25, 2010

(54) SOCKET FOR ELECTRONIC DEVICES

(75) Inventor: Masahiko Kobayashi, Tokyo (JP)

(73) Assignee: 3M Innovative Properties Company, St. Paul, MN (US)

( * ) Notice: Subject to any disclaimer, the term of this patent is extended or adjusted under 35 U.S.C. 154(b) by 64 days.

(21) Appl. No.: 12/088,758

(22) PCT Filed: Oct. 13, 2006

(86) PCT No.: PCT/US2006/040293

§ 371 (c)(1),
(2), (4) Date: Mar. 31, 2008

(87) PCT Pub. No.: WO2007/047546

PCT Pub. Date: Apr. 26, 2007

(65) Prior Publication Data
US 2008/0261457 A1 Oct. 23, 2008

(30) Foreign Application Priority Data
Oct. 17, 2005 (JP) ............................. 2005/301930

(51) Int. Cl.
H01R 13/62 (2006.01)
(52) U.S. Cl. .......................... 439/331; 439/70; 439/73
(58) Field of Classification Search ................. 439/331, 439/330, 73, 70, 525
See application file for complete search history.

(56) References Cited

U.S. PATENT DOCUMENTS

| 5,320,550 | A | * | 6/1994 | Uratsuji et al. | 439/266 |
|---|---|---|---|---|---|
| 5,498,970 | A | | 3/1996 | Petersen | |
| 5,718,595 | A | * | 2/1998 | Tohyama et al. | 439/330 |
| 5,807,127 | A | | 9/1998 | Ohshima | |
| 6,262,581 | B1 | | 7/2001 | Han | |
| 6,280,219 | B1 | * | 8/2001 | Sano et al. | 439/268 |
| 6,322,384 | B1 | * | 11/2001 | Ikeya | 439/331 |
| 6,638,091 | B2 | | 10/2003 | Yamagishi | |
| 6,666,691 | B2 | | 12/2003 | Ikeya | |
| 6,739,894 | B2 | * | 5/2004 | Ogura | 439/330 |
| 6,749,443 | B2 | | 6/2004 | Sano et al. | |
| 6,793,512 | B2 | | 9/2004 | Kudo et al. | |

(Continued)

FOREIGN PATENT DOCUMENTS

JP 11026122 1/1999

(Continued)

Primary Examiner—Tho D Ta
Assistant Examiner—Travis Chambers
(74) Attorney, Agent, or Firm—Johannes P. M. Kusters; Melanie G. Gover

(57) ABSTRACT

A socket (10) for electronic devices has a plurality of retainers (500). Each retainer (500) has a first member (501), a first shaft (507) for pivotably connecting a proximal portion of the first member with a lower frame (200) so the distal portion of the first member moves between an operative position in which the distal portion of the first member stays on the electronic device to make contact with an upper surface of the electronic device and an inoperative position in which the distal portion of the first member stays away from the electronic device, a second member (512) having a distal portion and a proximal portion, a second shaft (510) for pivotably connecting the distal portion of the second member with the intermediate portion of the first member; and a third shaft (517) for pivotably connecting the proximal portion of the second member with the upper frame.

5 Claims, 14 Drawing Sheets

U.S. PATENT DOCUMENTS

| | | |
|---|---|---|
| 6,848,928 B2 * | 2/2005 | Ikeya et al. ............. 439/331 |
| 6,875,025 B2 | 4/2005 | Hsu et al. |
| 6,899,558 B2 | 5/2005 | Okamoto |
| 7,214,084 B2 | 5/2007 | Hayakawa |
| 7,278,868 B2 | 10/2007 | Sato et al. |
| 2003/0054676 A1 | 3/2003 | Sano et al. |

FOREIGN PATENT DOCUMENTS

| | | |
|---|---|---|
| JP | 14343522 | 11/2002 |

* cited by examiner

SOCKET FOR ELECTRONIC DEVICES

TECHNICAL FIELD

The present invention relates to a socket for electronic devices. In particular, the present invention relates to a socket for testing actual performances of the electronic devices such as ball grid array (BGA) chips with a number of terminals of solder balls and land grid array (LGA) chips with a number of terminals of lands.

BACKGROUND

Japanese Patent Publication 2003-187937A discloses a test apparatus or socket for applying Burn-In Test to electronic devices such as integrated circuits and integrated circuit packages (e.g., BGA and LGA packages).

Generally, the socket includes a substrate having a number of contacts and a rectangular cover capable of moving vertically between elevated and lowered positions relative to the substrate and is forced in the elevated position by a plurality of springs mounted between the substrate and the cover. Also provided to the socket are a plurality of latching mechanisms, forcing downwardly the mounted electronic device toward the contacts to make reliable contacts between the terminals of the electronic device and the contacts of the socket. Each of the latch mechanism has a latching member pivotably mounted on the substrate and a link pivotably connected at its one end to the cover and at its opposite end to the latching member.

Referring to FIG. 15 depicting a conventional socket for testing electronic devices, the latching member 1001 has a distal end 1002 and a proximal end 1003 and is pivotably supported at its intermediate portion 1004 by the substrate 1005 so that the distal end 1002 is capable of making a contact with the upper surface of the mounted electronic device to be tested. The link 1005 includes a distal end 1006 pivotably connected to the proximal end 1003 of the latch 1001 and a proximal end 1007 pivotably connected to the cover 1008. With the illustrated arrangement, when the distal end 1002 of the latch 1001 is depressed onto the upper surface of the electronic device 1, it is subject to a reactive force F2 from resiliently supported contacts. The reactive force F2 is transformed through the link 1002 into another force F2' which forces the cover 1008 downward. This results in that, in order to force the electronic device 1 downward by the latches 1001 for making a reliable contacts between the terminals and the corresponding contact members, the biasing force F1 from the springs provided between the substrate 1005 and the cover 1008 should be increased considerably, which in turn requires a larger initial force F0 for depressing the cover. Disadvantageously, this results in a larger deformation such as warp of the circuit board for supporting the sockets. The deformation may result in an insufficient depressing of the covers, causing defective contact between the terminals and the contact members.

SUMMARY

To overcome the above-mentioned problems, a socket for electronic devices each having a plurality of terminals on at least one major surface thereof, comprises a lower frame having a plurality of electrically connecting means, each of the electrically connecting means making an electrical contact with a corresponding terminal of the electronic device;

an upper frame mounted on the lower frame and assembled with the lower frame so that the upper frame is capable of moving between an elevated position and a lowered position relative to the lower frame; and a plurality of retaining means for depressing the electronic device supported by the lower frame to have the terminals of the electronic device contact with the corresponding electrically connecting means, respectively;

wherein each of the retaining means has a first member having a distal portion, a proximal portion and an intermediate portion between the distal and proximal portions;

a first shaft for pivotably connecting the proximal portion of the first member with the lower frame so that the distal portion of the first member moves between an operative position in which the distal portion of the first member stays on the electronic device supported by lower frame to make a contact with an upper surface of the electronic device and an inoperative position in which the distal portion of the first member stays away from the electronic device;

a second member having a distal portion and a proximal portion;

a second shaft for pivotably connecting the distal portion of the second member with the intermediate portion of the first member; and a third shaft for pivotably connecting the proximal portion of the second member with the upper frame.

A second aspect of the present invention is a socket for electronic devices each having a plurality of terminals on at least one major surface thereof, comprises a contact holder having a plurality of resiliently deformable contacts arranged corresponding to an arrangement of the terminals of the electronic device and a substrate for holding the resiliently deformable contacts;

a lower frame surrounding the contact holder;

an upper frame disposed on the lower frame for movement between an elevated position and a lowered position;

means for biasing the upper frame into the elevated position; and a plurality of means for forcing the electronic device supported by the lower frame downward and retaining the electronic device to make the terminals of the electronic device contact with the corresponding resiliently deformable contacts;

wherein each of the forcing and retaining means has a first member having a distal portion, a proximal portion and an intermediate portion between the distal and proximal portions;

a first shaft for pivotably connecting the proximal portion of the first member with the lower frame so that the distal portion of the first member moves between an operative position in which the distal portion of the first member stays on the electronic device supported by lower frame to make a contact with an upper surface of the electronic device and an inoperative position in which the distal portion of the first member stays away from the electronic device;

a second member having a distal portion and a proximal portion;

a second shaft for pivotably connecting the distal portion of the second member with the intermediate portion of the first member; and a third shaft for pivotably connecting the proximal portion of the second member with the upper frame.

A third aspect of the present invention is a socket wherein both the second and third shafts stay in a horizontal plane or a substantially horizontal plane when the distal portion of the first member takes the operative position.

A fourth aspect of the present invention is socket wherein the distal portion of the first member has a flatted portion which is capable of making contact with the upper surface of the electronic device when the distal portion of the first member takes the operative position.

A fifth aspect of the present invention is a socket which includes a guide frame disposed within an opening defined by the lower frame so that the electronic device is received through the guide frame by the lower frame.

A sixth aspect of the present invention is a socket with second biasing means for forcing the guide frame upward relative to the contact holder.

A seventh aspect of the present invention is a socket comprising resiliently deformable contacts disposed in an arrangement substantially similar to that of electric terminals of the electronic device;
 a lower frame for supporting the electronic device with the terminals exposed to the corresponding resiliently deformable contacts, respectively;
 an upper frame disposed on and connected with the lower frame so that the upper frame moves between an elevated position and a lowered position relative to the lower frame;
 springs disposed between the lower and upper frames for forcing the upper frame into the elevated position; and
 retainers disposed on opposite sides of the electronic device supported by the lower frame and connected to the lower and upper frames so that, when the upper frame takes the lowered position, the retainers stays away from the electronic device supported by the lower frame and, when the upper frame takes the elevated position, the retainers forces the electronic device to make reliable contacts between the terminals of the electronic device and the corresponding resiliently deformable contacts, each of the retainers being so designed that, when the upper frame takes the elevated position, a reactive force that the retainer receives from the electronic device is transformed in its entirety or substantially entirety into a horizontal force which is then transmitted to the upper frame.

BRIEF DESCRIPTION OF THE DRAWINGS

The present invention will become more fully understood from the detailed description and the accompanying drawings, wherein.

DETAILED DESCRIPTION

The socket according to the present invention has various advantages. For example, according to the inventions of claims 1 and 2, the depressing force from the retainers to the electronic device is dispersed, reducing a reactive force applied to a depressing device when depressing the upper frame into the lowered position and an associated force applied to a circuit board supporting the sockets.

According to the invention of claim 3, when the first element is in the operative position, the second and third shafts stays in a horizontal or substantially horizontal plane, in which a reactive force applied to the electronic device from the contacts is transformed into a horizontal force in its entirety. This reduces the biasing force from the biasing means provided between the lower and upper frames, which minimizes a possible deformation of the circuit board supporting the sockets and attains reliable contacts between the terminals of the electronic device and the resiliently deformable contacts.

According to the invention of claim 4, the flatted portion of the first member allows the depressing to be made through enlarged forcing surfaces, which ensures reliable contacts between the terminals of the electronic device and the resiliently deformable contacts.

According to the invention of claim 5, the electronic device is reliably positioned to the lower frame by means of the guide frame.

According to another invention, a proper positioning of the electronic device relative to the electrically connecting means or resiliently deformable contacts before the actual contacts thereof.

According to another invention, a biasing force from the biasing means between the upper and lower frames is minimized. This results in that the depressing force for depressing the upper frame is reduced to the biasing force from the biasing means, which minimizes a possible deformation of the circuit board supporting the sockets and attains reliable contacts between the terminals of the electronic device and the resiliently deformable contacts.

The following description of the preferred embodiments are merely exemplary in nature and are in no way intended to limit the invention, its application, or uses. Although the terms "upper," "lower," "left," "right" "vertical," "horizontal," and derivatives thereof are used in the following descriptions, the usage of such terms intends a better understanding of the present invention and is not to be considered as limiting, unless the claims expressly state otherwise.

Figure 1:
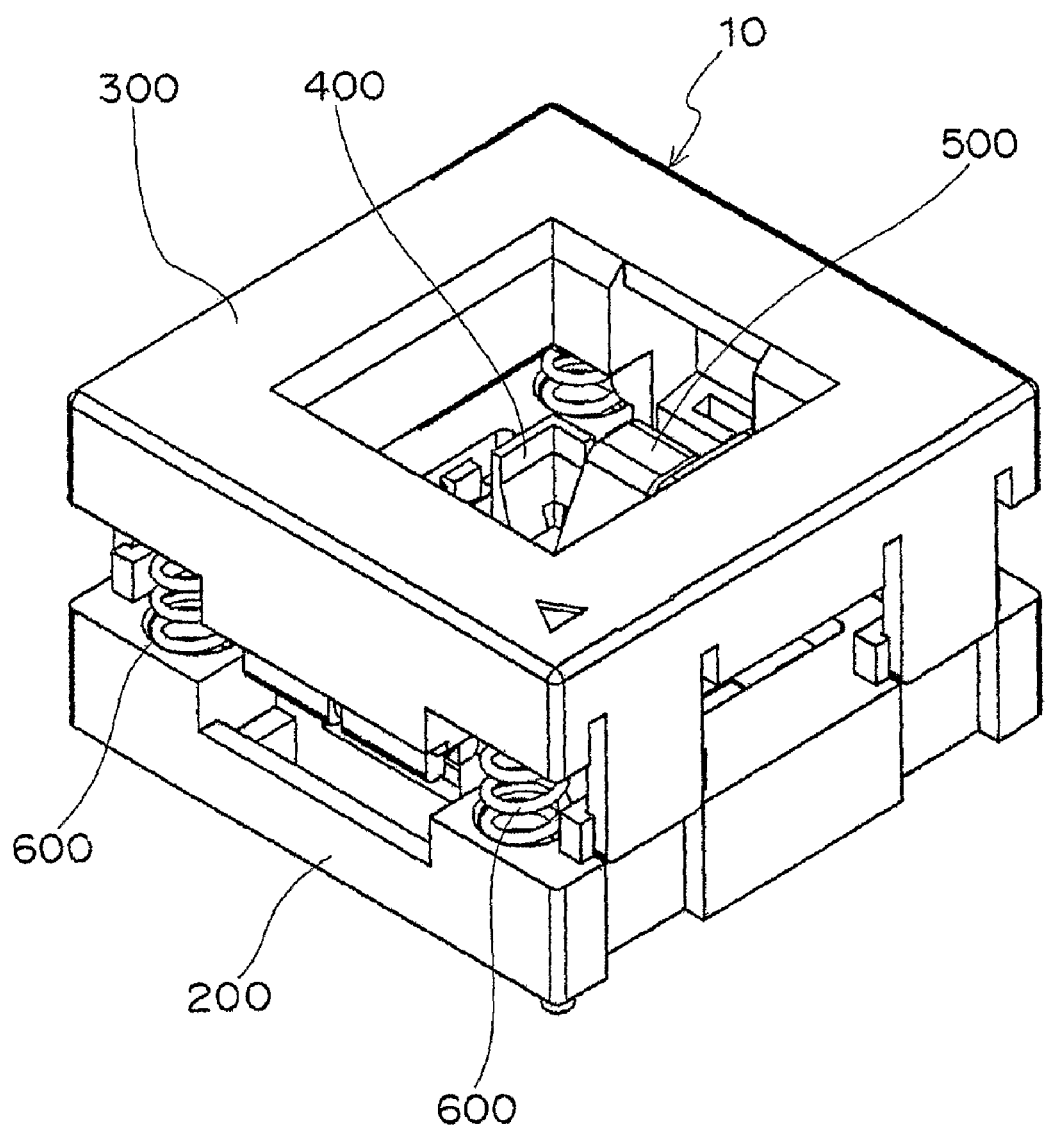
FIG. 1 is a perspective view of a first embodiment of the socket for testing electronic devices according to the present invention.
Figure 2:
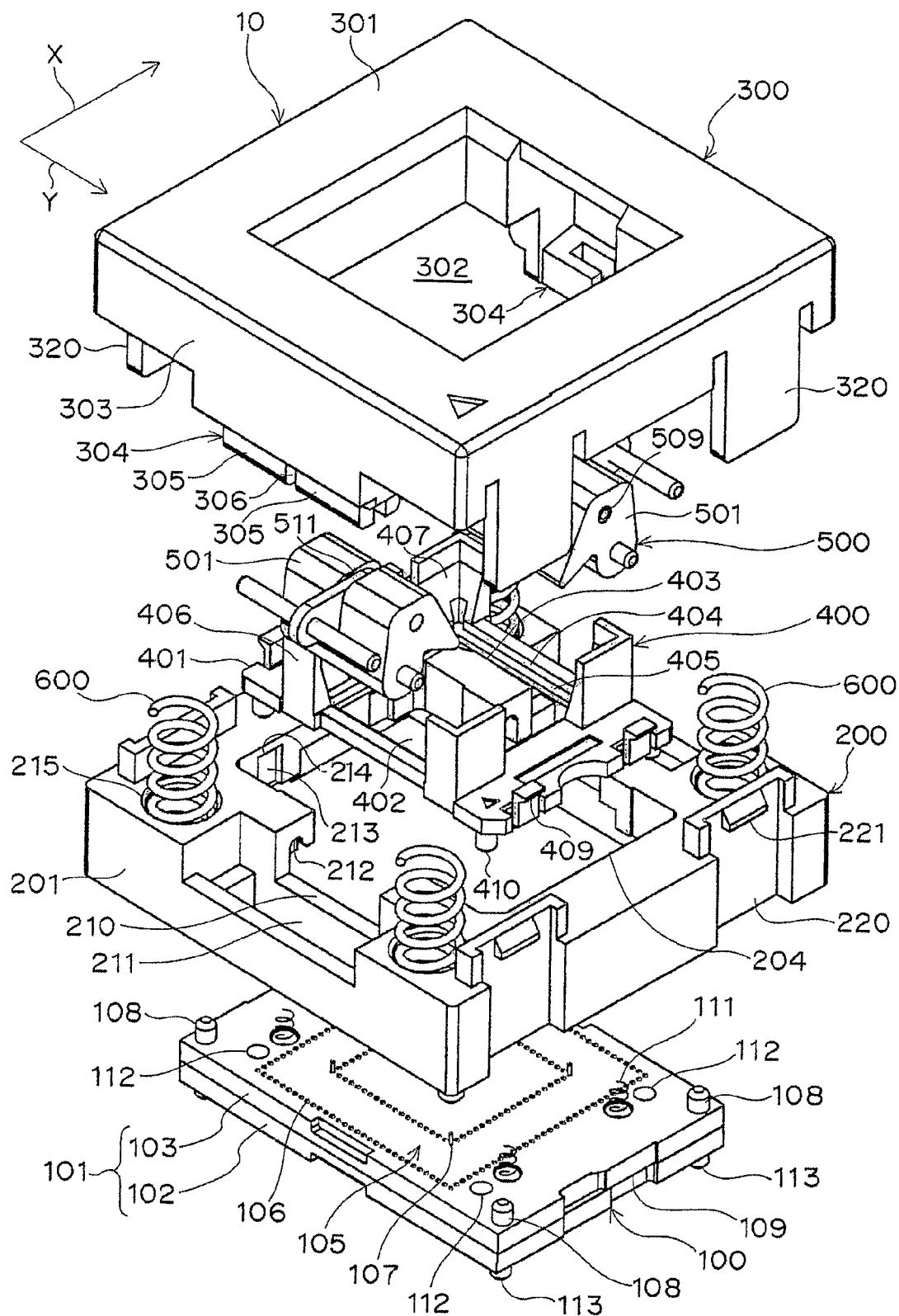
FIG. 2 is an exploded perspective view of the socket in FIG. 1.

FIG. 1 depicts a socket, generally indicated by reference numeral 10, according to the first embodiment of the present invention, for testing electronic devices such as ball grid array (BGA) chips and land grid array (LGA) chips, each having a number of terminals (i.e., solder balls, lands) arranged in a lattice or zigzag geometry on its major surface or bottom surface. As best illustrated in FIG. 2, the socket 10 of this embodiment has, for example, a contact means or contact holder 100, a lower frame 200, an upper frame 300, a guide frame 400, holding means or retainers 500 and biasing means or springs 600.

The contact holder 100 includes a rectangular substrate 101 having a lower plate 102 and an upper plate 103, each made of electrically insulative material. The lower plate 102 and the upper plate 103 are detachably connected by means of suitable connecting members such as bolt and nut mechanisms and latching mechanisms (both not shown). A central region 105 of the upper plate 103, for example, in the form of rectangular configuration, has a number of apertures or contact holes 106. Although not shown, a region of the lower plate 103, opposing the region 105, has a number of apertures or contact holes. The holes 106 are arranged in a lattice or zigzag geometry, at regular intervals in horizontal, two orthogonal directions, i.e., X- and Y-directions in the drawing, in each of which an electrically connecting means or contact 107 is accommodated. Although the region 105 is in the form of rectangular frame, it may be other configuration such as simple, square configuration and rectangular configuration. In any event, the configuration of the contact region is preferably determined corresponding to an arrangement of terminals on electronic devices to be tested.

Although not shown, the contact 107 is made of elongated, electrically conductive rod-like member having an upper portion (upper contact portion), a lower portion (lower contact portion) and an intermediate, resiliently deformable portion or spring portion. The upper portion of the contact 107 is extended out through the hole 106 of the upper plate 103 while the lower portion of the contact 107 is extended out through an associated opposing hole in the lower plate 102 (see FIGS. 8-10). The intermediate spring portion, which is preferably formed by bending the intermediate portion of the contact 107, is accommodated within a cavity defined between the lower and upper plates as it is compressed between the upper and bottom walls defining the cavity. This causes that the upper and lower portions of the contact are retained in the illustrated elevated and lowered positions, respectively, by the resilient force from the compressed intermediate spring portion. An example of the contact structure and the arrangement is fully disclosed in the U.S. Pat. No. 5,055,777, the disclosure of which is incorporated herein in its entirety by reference. Another example of the contact, which is made of upper and bottom projecting portions and a spring provided between the upper and bottom projecting portions, is disclosed in the Japanese Patent Publication No. 2004-47376, which is also incorporated herein in its entirety by reference. It should be understood that the structure and material of the contact are not limited to those described above, the contact may be constituted by an electrically conductive sheet member or substrate having an electrically insulative sheet or substrate and electrical contacts mounted on the sheet or substrate.

Figure 3:
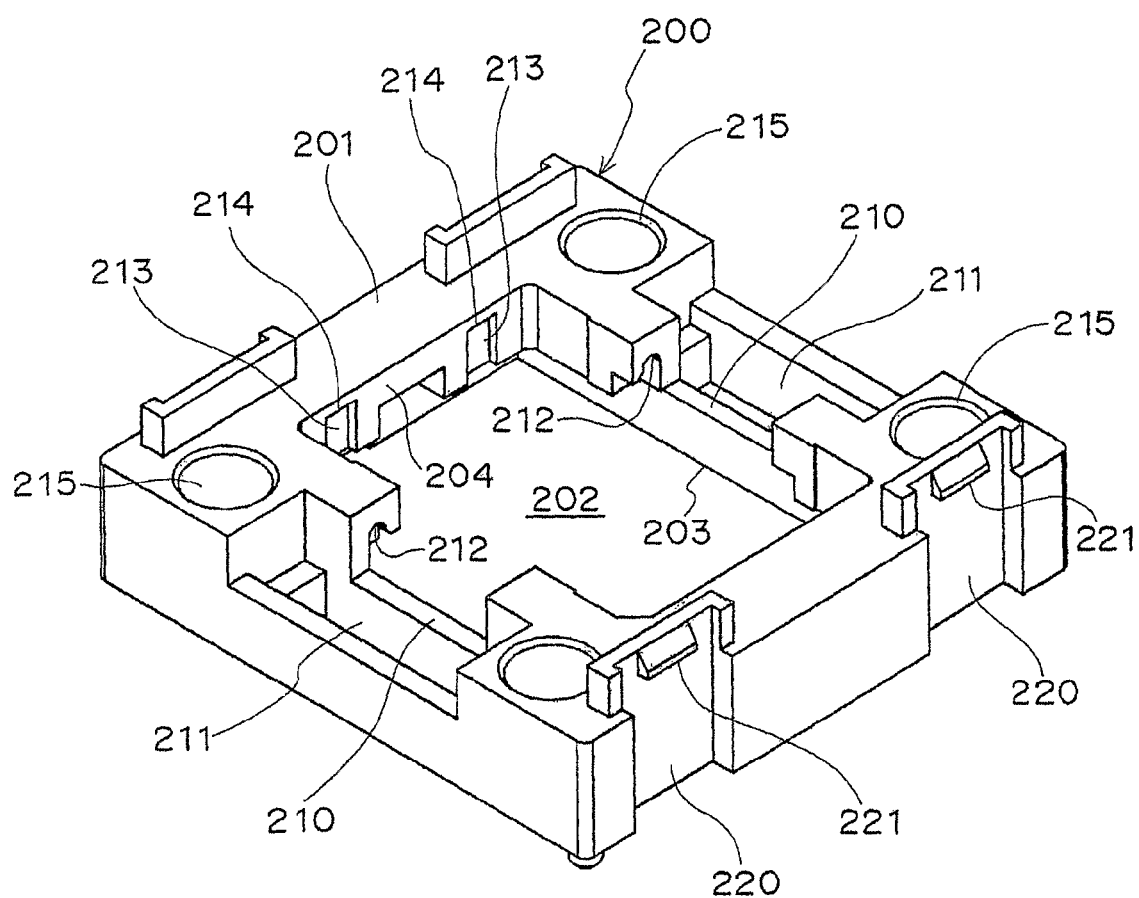
FIG. 3 is a perspective view of a lower frame of the socket.
Figure 4:
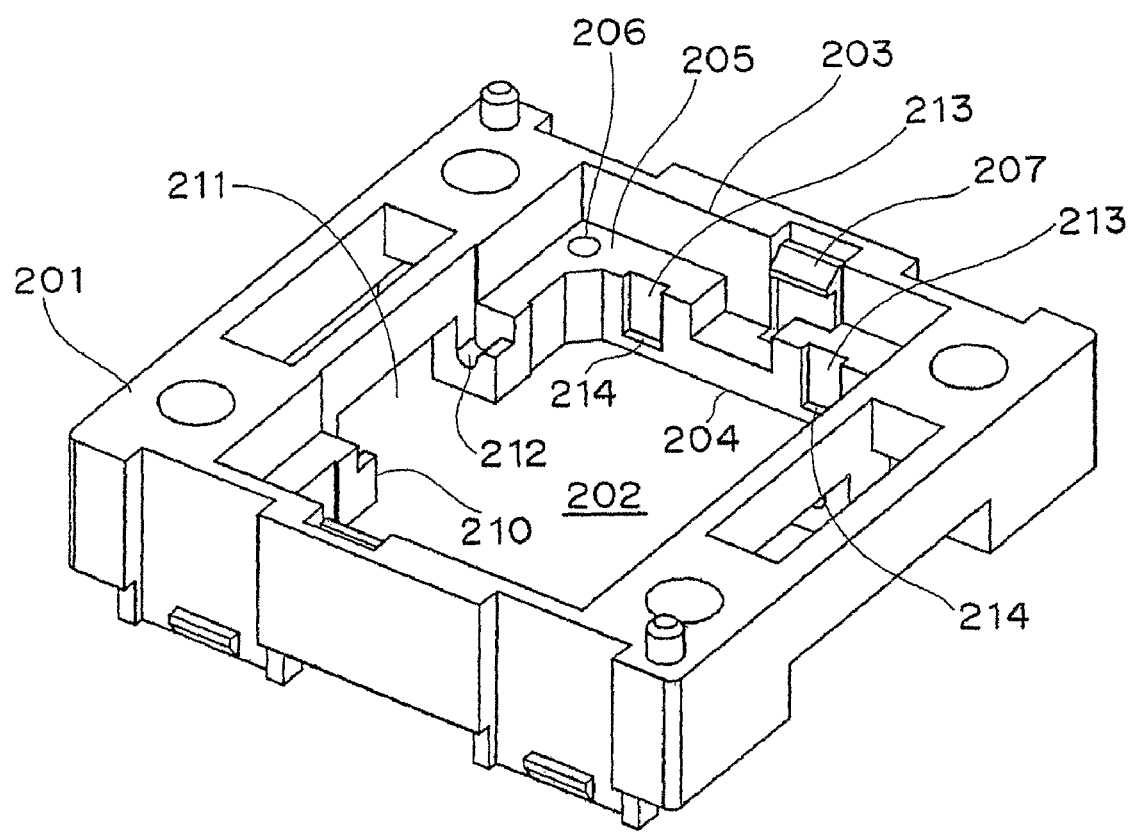
FIG. 4 is a perspective view of the lower frame of the socket in which the lower frame is turned upside down.

Referring to FIGS. 3 and 4, the lower frame 200 has a substantially rectangular frame portion 201, made of electrically insulative material, defining therein a central opening 202 extending through top and bottom surfaces thereof. The opening 202 has a lower opening portion 203 so sized and shaped as to receive the contact holder 100 and an upper opening portion 204 so shaped and sized as to receive the guide frame 400. The contact holder 100 is larger in size than the guide frame 400, an internal dimension of the lower opening 203 is larger than that of the upper opening 204, defining a support 205 formed by a downwardly facing, annular horizontal step which surrounds the smaller upper opening 203 between the lower and upper openings 203 and 204 (see FIG. 4).

Figure 10:
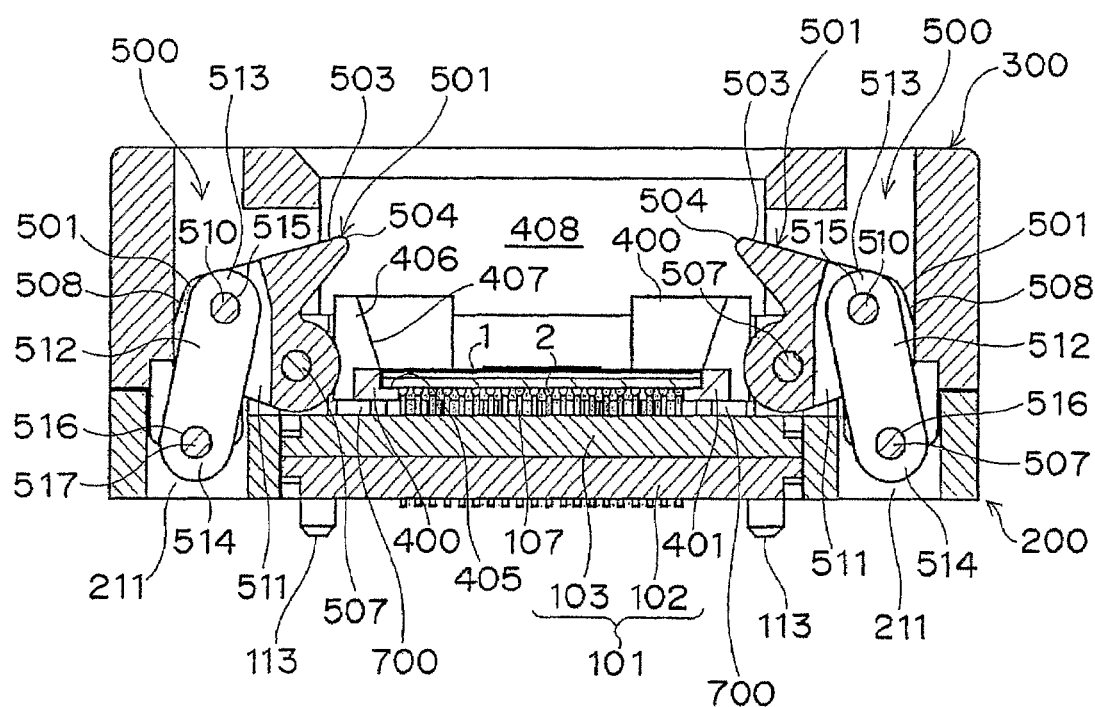
FIG. 10 is a cross sectional view showing the socket in the inoperative position.

The lower frame 200 is structured to support each of the pair of retainers 500 for movement between an operative position (see FIG. 8) and an inoperative position (see FIG. 10). Specifically, as shown in FIGS. 2-4, the lower frame 200 includes a pair of cutouts or first recesses 210 opposing to each other across the central opening 202. Preferably, the first recesses 210 are formed by removing opposing wall portions defining the upper opening portion 204. A second recess 211 is provided behind each of the first recesses 210 in communication therewith. A pair of bearing recesses 212 or bearing portions are provided on opposite, right and left sides of the first recess 210, in the vicinity of the upper opening portion 204, to define a first bearing mechanism for supporting the retainer 500 in conjunction with a second bearing mechanism of the upper frame 300 which will be described below.

Figure 5:
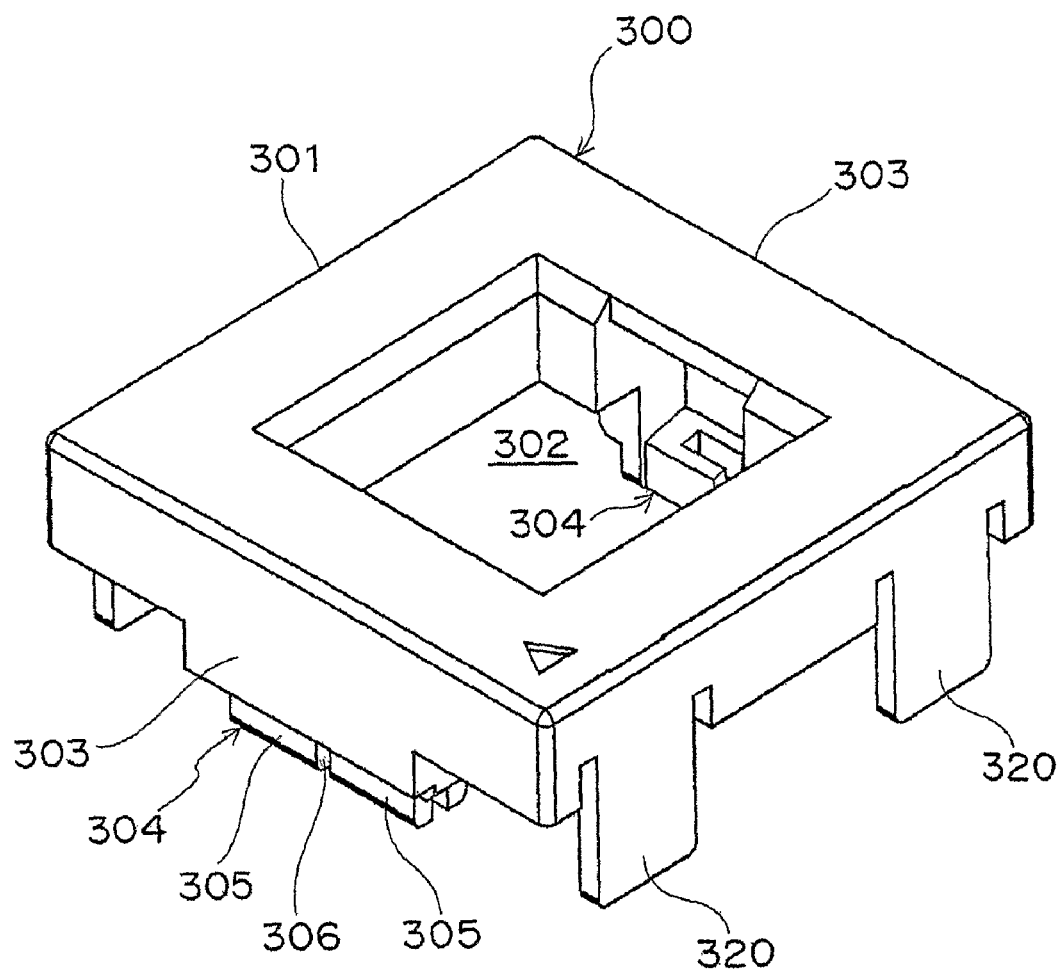
FIG. 5 is a perspective view of an upper frame of the socket.
Figure 6:
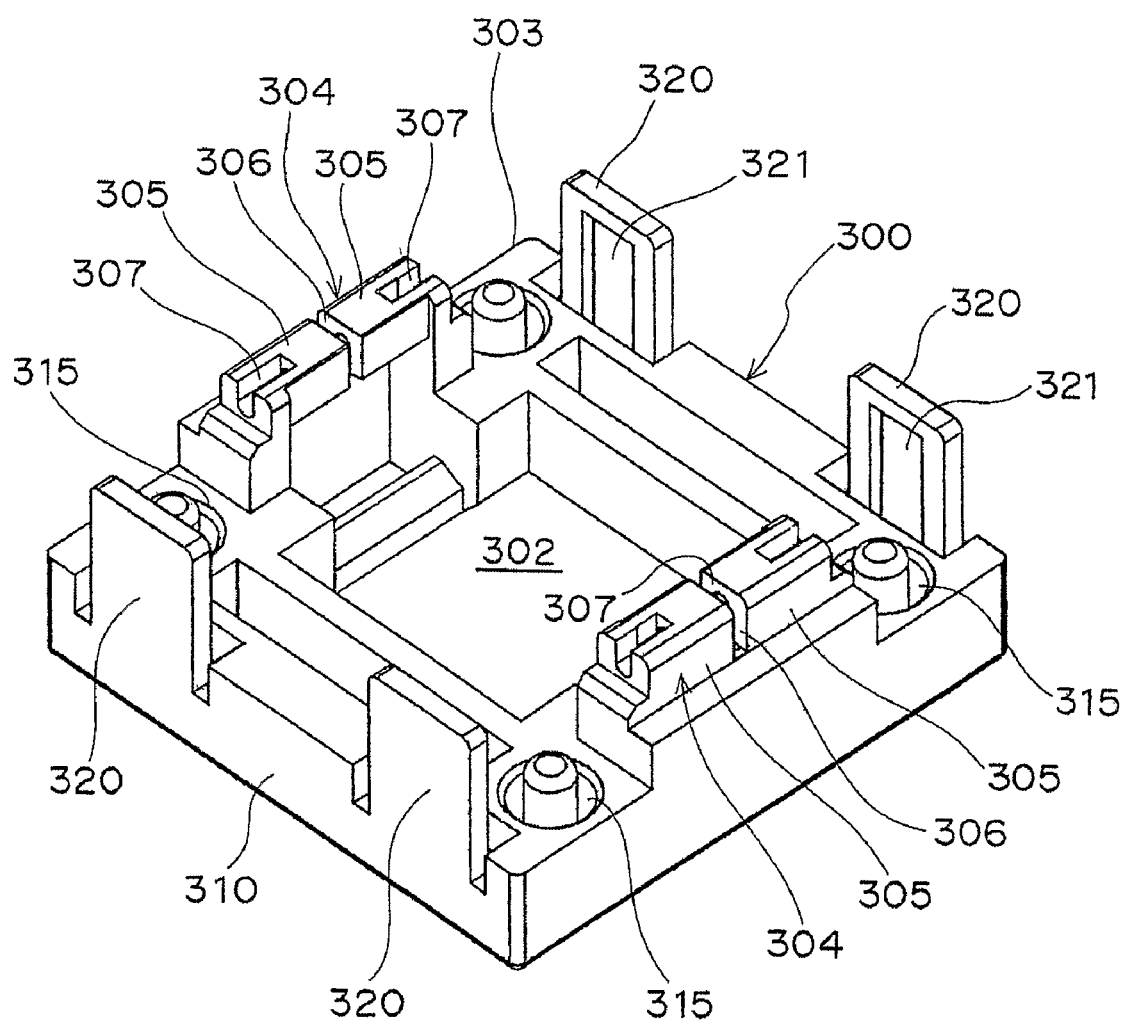
FIG. 6 is a perspective view of the upper frame in which the upper frame is turned upside down.

Referring to FIGS. 5 and 6, the upper frame 300 has a substantially rectangular frame portion 301, made of electrically insulative material, defining a central opening 302 extending through top and bottom surfaces thereof. The opening 302 is so sized and shaped that the electronic device is introduced therein from above without any interference with the upper frame 300. The opposing frame portions 303 of the upper frame 300 have, on their lower surfaces, bearing mechanisms generally indicated by reference numeral 304 which cooperate with the first bearing mechanisms 212 of the lower frame 200 to support the retainers 500. Each of the bearing mechanisms 304 has a pair of spaced, downwardly projected supports 305 arranged adjacent and along the inner periphery defining the opening 302, leaving a gap therebetween to define a slot 306 extending in the opposing direction, i.e., X-direction. The supports 305 have bearing holes 307, respectively, extending in alignment in a direction (i.e., Y-direction) perpendicular to the opposing direction (X-direction) of the bearing mechanisms 304 (see FIG. 6).

Figure 7:
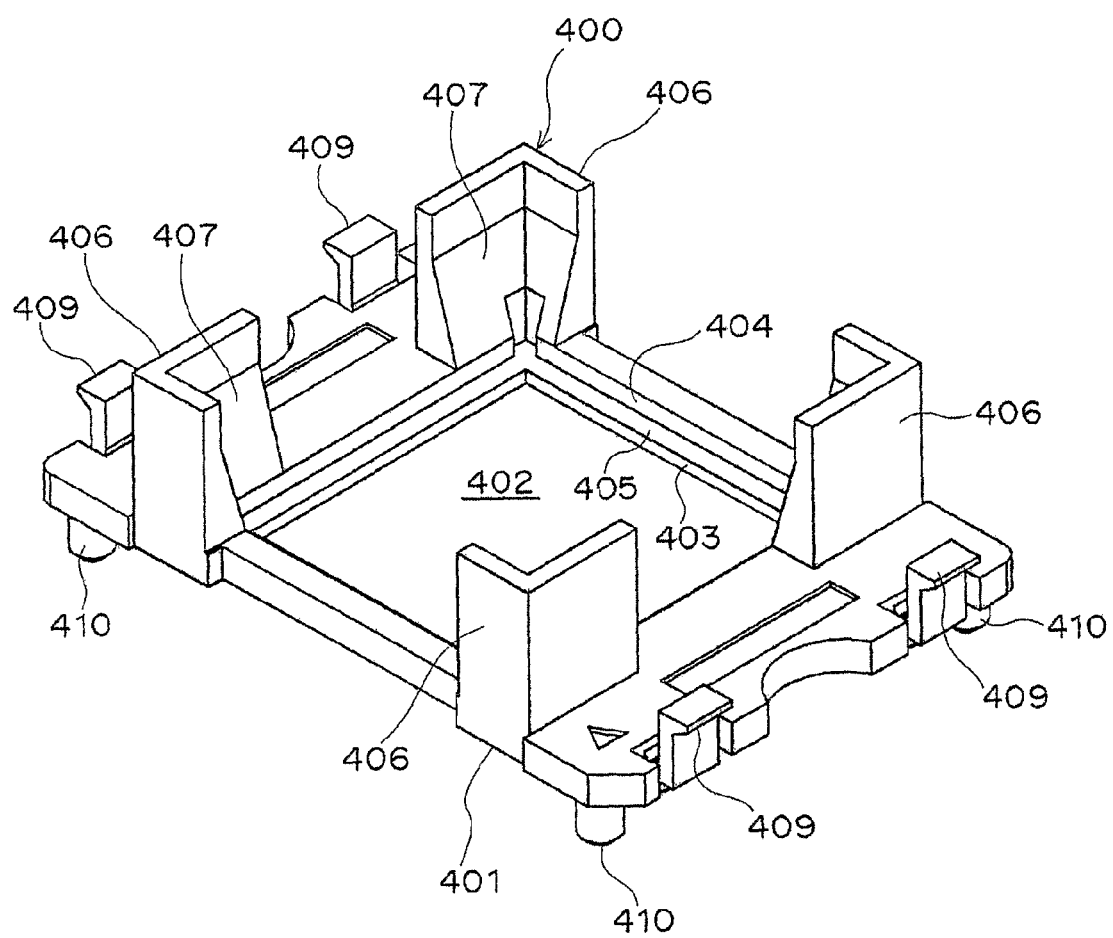
FIG. 7 is a perspective view of the guide frame of the socket.

Referring again to FIG. 7, the guide frame 400 has a rectangular frame portion 401 made of electrically insulative material. The frame portion 401 is so sized and shaped that it can be accommodated within the upper opening portion 204 of the lower frame 200 and has a rectangular central opening 402 defined therein. The opening 402 includes a lower opening portion 403 with an internal dimension similar to but slightly smaller than the external dimension of the electronic device, an upper opening portion 404 with an internal dimension substantially identical to an external dimension of the electronic device and an upwardly facing, annular rectangular step or support 405 between the lower and upper opening portions 403 and 404 for supporting the electronic device. A plurality of corner guides 406 are provided on respective four corners of the upper surface of the frame portion 401 to define a device insertion passage 408 (see FIGS. 8-10) above the upper opening portion 404. Each of the corner guides 406 has a corner guide surface 407 which is inclined inwardly and downwardly, allowing the electronic device to be smoothly inserted into the upper opening portion 404.

The guide frame 400 also has four resilient projections 409 provided symmetrically around the outer periphery of the frame portion 401. Corresponding to those projections 409, the lower frame 200 has, on its inner peripheral portions defining the upper opening portion 204, four vertically extending grooves 213 each with upper restrictions or stops 214 (see FIG. 3). When the guide frame 400 is mounted within the upper opening 204, the projections 409 and the grooves 213 are connected to each other with the projections 409 accommodated within the vertical grooves 213, respectively, allowing the guide frame 400 to move vertically as it is guided by the upper opening 204. Four biasing members such as helical springs 111 are provided between the guide frame 400 and the contact holder 100 to force the guide frame 400 into its elevated position where the projections 409 abut respective stops 214.

Referring to FIGS. 2 and 8-10, each retainer 500 has a first member or depressing block 501 made of electrically insulative material. The depressing block 501 has a main portion 502 and a depressing portion 503 projected from one end of the main portion 502. A proximal end portion 505 of the main portion 502 has a first through-hole 506 in which a first bearing shaft 507 is inserted with its opposite ends protruded therefrom. An angled intermediate portion 508 of the depressing block 501 has a second through-hole 515 extending substantially in parallel to the first through-hole 506 (see FIG. 2), in which a second bearing shaft 510 is inserted. The depressing block 501 further has a slot 511 extending across the through-hole 515 (see FIG. 2), within which a portion of the second shaft 510 is exposed. A second member or link bar 512 has a first portion or distal bearing portion 513 and a second portion or proximal bearing portion 514. The distal and proximal bearing portions 513 and 514 have third and fourth through-holes 515 and 516, respectively, extending in parallel to each other. A second shaft 510 is inserted through the through-hole 515 of the distal bearing portion 513 so that the link bar 512 is pivotably connected to the second shaft 510. Also, a third shaft 517 is inserted through the through-hole 516 of the distal bearing portion 514. Preferably, a plurality of link bars each having individual distances between the through-holes 515 and 516 (between centers of the through-holes 515 and 516) are prepared and used selectively to control the depressing conditions of the electronic devices, as necessary.

The structural elements so constructed are assembled to each other. Specifically, as shown in FIG. 2, the contact holder 100 is mounted in the lower opening 203 of the lower frame 200 from below with the upper portions of the contacts 107 exposed to the upper opening 204. The mounted contact holder 100 is immovably positioned and secured relative to the lower frame 200. For this purpose, preferably the contact holder 100 has four positioning pins or projections 108 at respective four corners of the upper surface of the substrate 101 and the lower frame 200 has four recesses 206 at respective four corners of the support 205 or step (see FIG. 4) so that, when the contact holder 100 is mounted on the lower frame 200, the positioning projections 108 engage in the corresponding recesses 206. Also, to prevent the contact holder 100 from dropping from the lower frame 200, the contact holder 100 has a plurality of engagement recesses 109 in its outer periphery and the lower frame 200 has a plurality of engagement projections 207 (see FIG. 4) in its associated inner periphery so that, when the contact holder 100 is mounted in the lower frame 200, the engagement projections 207 engage with the corresponding engagement recesses 109 to retain the contact holder 100 immovably in the vertical direction.

The guide frame 400 is mounted in the upper opening 204 of the lower frame 200 with the resilient projections 409 of the guide frame 400 engaged with the corresponding vertical grooves 213 of the lower frame 200. A plurality of springs 111 are placed between the guide frame 400 and the contact holder 100. This results in that the guide frame 400 is forced upward, causing the uppermost ends of the projections 409 to bring into contacts with the corresponding upper stops 214 of the grooves 213 where guide frame 400 is retained in its elevated position.

To properly position the guide frame 400 mounted in the lower frame 200 relative to the contact holder 100, the contact holder 100 has positioning recesses 112 in its upper surface and the guide frame 400 has corresponding positioning projections 410 in its lower surface. This allows that the contact holder 100 and the guide frame 400 in the lower frame 200 are positioned properly relative to each other due to the engagements of the positioning recesses 112 and the positioning projections 410.

As shown in FIGS. 2 and 8-10, the retainers 500 are assembled with the lower and upper frames 200 and 300. At assembling, each depressing block 501 is accommodated within the recess 210 of the lower frame 200 with its depressing portion 503 positioned adjacent the central opening 202. The first shaft 507 of the retainer 500 is positioned in the neighboring bearing recesses 212 of the lower frame 200. The depressing block 501 so assembled is capable of rotating about the first shaft 507 between an inoperative position where it is fully retracted outside the device insertion passage 408 (see FIG. 9) and an operative position where it is projected into the device insertion passage 408 to bring into contact with the upper peripheral surface of the electronic device already mounted (see FIG. 8). The proximal bearing portion of the link bar 512 free of third shaft 517 is received within the slot 306 of the upper frame 300. Then, the third shaft 517 is inserted through the bearing holes 307 of the upper frame 300 and the proximal through-hole 516 of the link bar 512 aligned therewith.

The springs 600 are positioned at respective four corners of and between the lower and upper frames 200 and 300. To hold the springs 600 between the lower and upper frames 200 and 300 in a stable manner, the four corners of the supper surface of the lower frame 200 and the opposing four corners of the lower surface of the upper frame 300 have respective positioning recesses 215 and 315 for holding the upper and lower portions of the springs 600, respectively.

A plurality of restricting means are provided to the lower and upper frames 200 and 300 for retaining upper frame 300 in its elevated position relative to the lower frame 200 (see FIG. 1) against the biasing force from the springs 600. In this embodiment, for example, a plurality of vertical grooves 220 are formed symmetrically in the peripheral surface of the lower frame 200. Each of the grooves 220 has an engagement projection 221 formed integrally within an upper portion of each groove 220. On the other hand, a plurality of downwardly extending engagement legs 320 are provided to the upper frame 300 so that, when the upper frame 300 is assembled to the lower frame 200, the legs 320 engage with the corresponding grooves 220 from above. Each of the engagement legs 320 has a vertical groove 321 in its inner surface for receiving the engagement projection 221 when the engagement leg 320 is engaged with the corresponding vertical groove 220. This allows that, when the upper frame 300 is assembled to the lower frame 200, the engagement legs 320 of the upper frame 300 are received in the corresponding outer vertical grooves 220 while the engagement projections 221 of the lower frame 200 are received in the corresponding inner vertical grooves 321 of the upper frame 300 (see FIG. 6). Also, each of the lower ends of each groove 321 engage with the corresponding engagement projections 221 due to the upward biasing forces from the springs 600, where the upper frame 300 is retained in its elevated position.

The sockets 10 so assembled are arranged in a predetermined pattern on the circuit board not shown. The lower contact portion of each contact 107 of the contact holder 100 of each socket 10 is brought into contact and connected with the corresponding terminal on the circuit board. To ensure a reliable physical and electrical contact with each contact 107 with the corresponding terminal on the board, as shown in FIG. 2, the contact holder 100 has positioning projections 113 at respective four corners of its lower surface and the circuit board has corresponding positioning recesses so that, when the socket 10 is mounted on the circuit board, the positioning projection 113 engages in the corresponding positioning recess of the circuit board.

Figure 8:
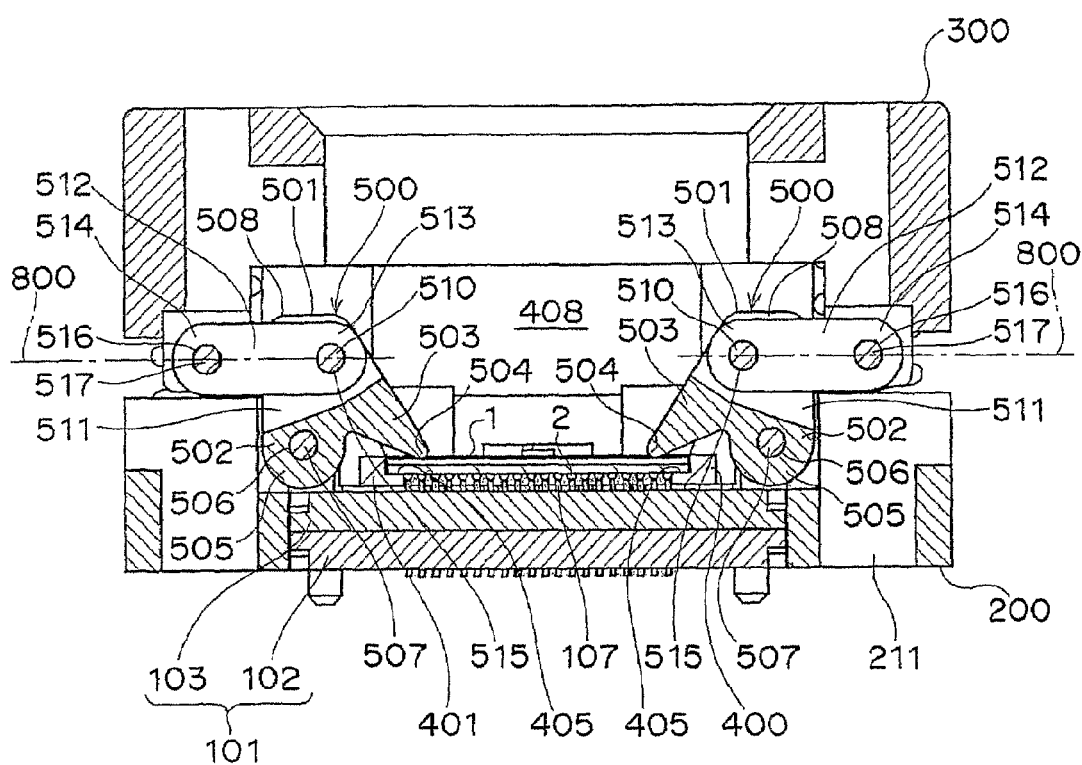
FIG. 8 is a cross sectional view showing the socket in an operative position.
Figure 9:
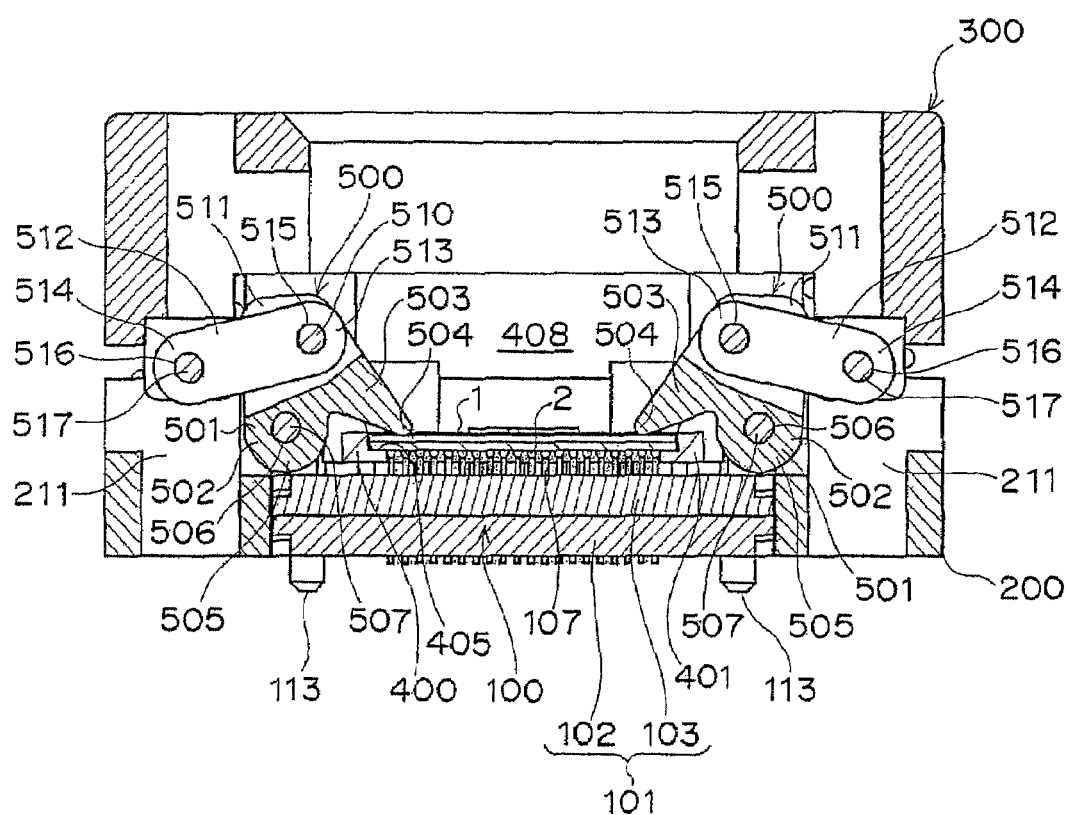
FIG. 9 is a cross sectional view showing the socket in an intermediate position between the operative and inoperative positions (FIGS. 7 and 9, respectively)
Figure 11:
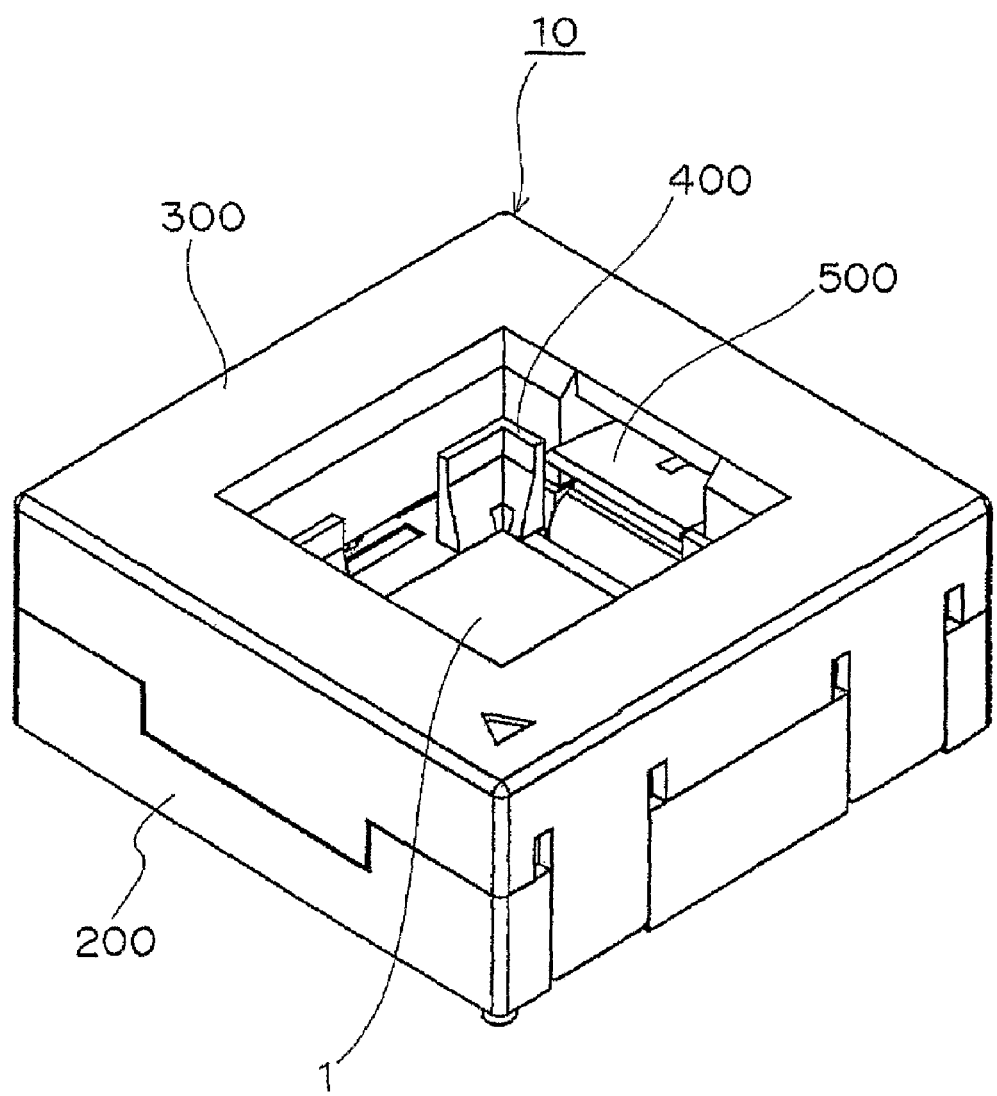
FIG. 11 is a perspective view showing the socket in the lowered position.

In test operation for the electronic devices, the upper frame 300 of each socket 10 fixed on the circuit board is depressed downward by a depressing device not shown (see FIG. 11). As shown in FIGS. 8-10, this causes the upper frame 300 to move downward, during which the proximal bearing portions 514 of the link bars 512 and the third shafts 517 supported by the upper frame 300 move downward within respective second recesses 211. This in turn causes that the depressing blocks 501 rotatably connected at the distal bearing portions 513 of the link bars 512 rotate backward about respective second shafts 510. When the upper frame 300 is lowered into the fully depressed position, i.e., lowered position, relative to the lower frame 200, the depressing blocks 501 are fully retracted outside the device insertion passage 408 to open it.

The electronic device 1 to be tested (see FIGS. 8-10) is mounted in the upper opening 404 of the guide frame 400 from above through the device insertion passage 408 by means of, for example, a vacuum device not shown. As shown in FIG. 10, in this state the guide frame 400 is retained in its elevated position by the biasing force from the springs 111, leaving a predetermined gap 700 between the lower surface of the guide frame 400 and the opposing substrate 101 of the contact holder 100. Preferably, in this state the terminals on the lower surface of the electronic device make resilient contacts with the corresponding contacts 107 of the contact holder 100.

The downward depressing force is then removed from the upper frame 300. This results in that, as shown in FIGS. 8-10, the upper frame 300 returns its elevated position by the biasing force of the springs 600. With this elevating movement of the upper frame 300, the proximal bearing portions 514 of the link bars 512 are elevated. This causes that the distal bearing portions 513 of the link bars 512 and the depressing blocks 501 pivotably connected thereto are rotated forward into the device insertion passage 408 to bring the distal end portions (depressing points) 504 of the depressing blocks 501 into contact with the upper surface of the electronic device 1 supported by the guide frame 400, forcing the electronic device 1 and the guide frame 400 into their lowered positions. This results in that the terminals 2 of the electronic device 1 are forced to the corresponding contacts 107 of the contact holder 100, which stabilizes the electric contacts between the terminals 2 and the corresponding contacts 107. Simultaneously, the contacts 107 of the contact holder 100 are forced against the terminals of the circuit board not shown to establish a reliable electric contact between the electronic device and the circuit board.

As best shown in FIG. 8, when the depressing block 501 is in its operative position in which it depresses the electronic device 1, the fulcrums supporting the opposite ends of the link bar 512, i.e., the second and third shafts 510 and 517, stay in a horizontal plane 800 or in a substantially horizontal plane. In this condition, as illustrated in FIG. 11, each of the distal portions 504 is subject to a vertical, reactive force F2 from the resiliently compressed contacts 107. The reactive force F2 is transformed into an axial compression force F2' of the link bar 512 pivotably connected to the depressing block 501, which is then transferred to the upper frame 300 outwardly and horizontally, but not vertically, because the fulcrums of the link bar 512 stay in the substantially horizontal plane 800. This means that an initial reactive force F0 that the depressing device is subject to at the depressing operation of the upper frame 300 is substantially equal to but no more than the biasing force F1 from the springs 600, namely the circuit board as well as the depressing device receives from the springs the biasing force N·F1 (N: the number of sockets) at the most at the simultaneous operations of N-sockets on the circuit board, which in turn minimizes the deformation such as warp of the circuit board. This also allows that each socket 10 can be depressed with a substantially constant force.

Figure 14:
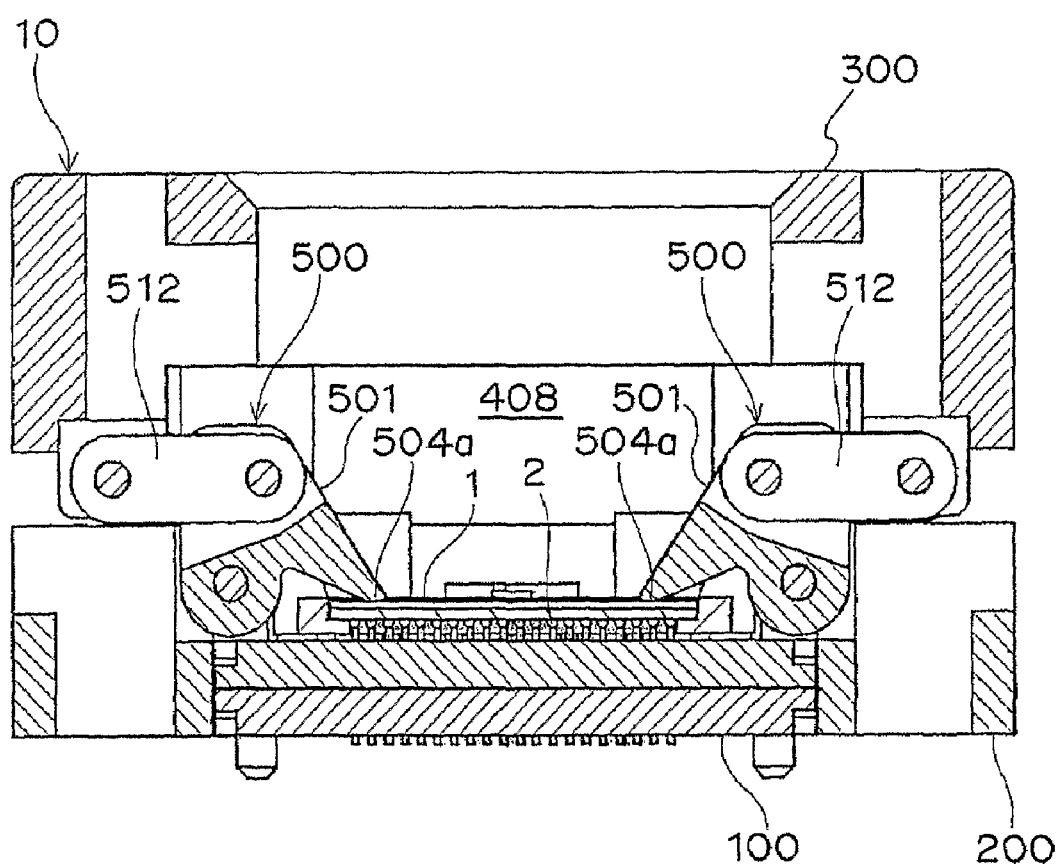
FIG. 14 is a cross sectional view showing another embodiment of the present invention.

Preferably, as shown in FIG. 14, a distal end portion (depressing point) 504 of the depressing block 501 has a flatted portion 504a in order to prevent a possible upward warp of the electronic device and the resultant defective contacts between the terminals of the electronic device and the corresponding contacts 107, which might otherwise be caused when the electronic device is depressed simultaneously at its opposite ends by the depressing distal end portions 504. Also, with this arrangement, each of the flatted portions 504a makes a surface-to-surface contact with the electronic device, which causes a reliable contact between the terminals of the electronic device and the contacts.

Figure 12:
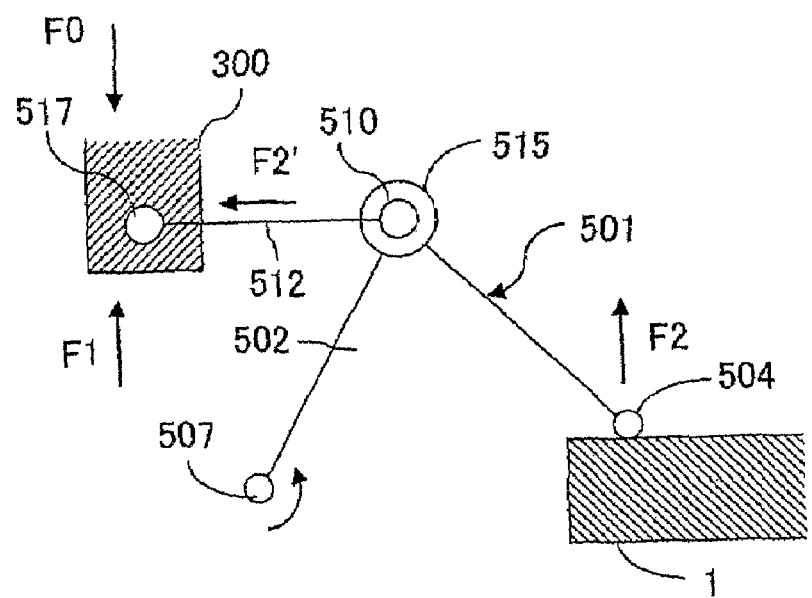
FIG. 12 is a diagram schematically illustrating a force distribution in the socket according to the present invention.
Figure 15:
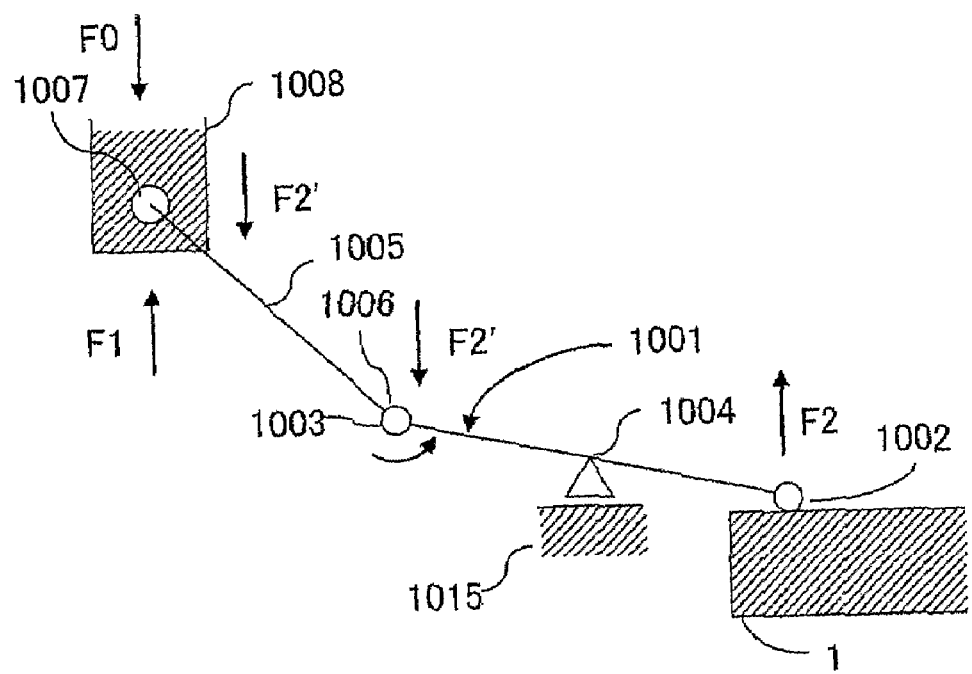
FIG. 15 is a diagram schematically illustrating a force distribution in the conventional socket.
Figure 13:
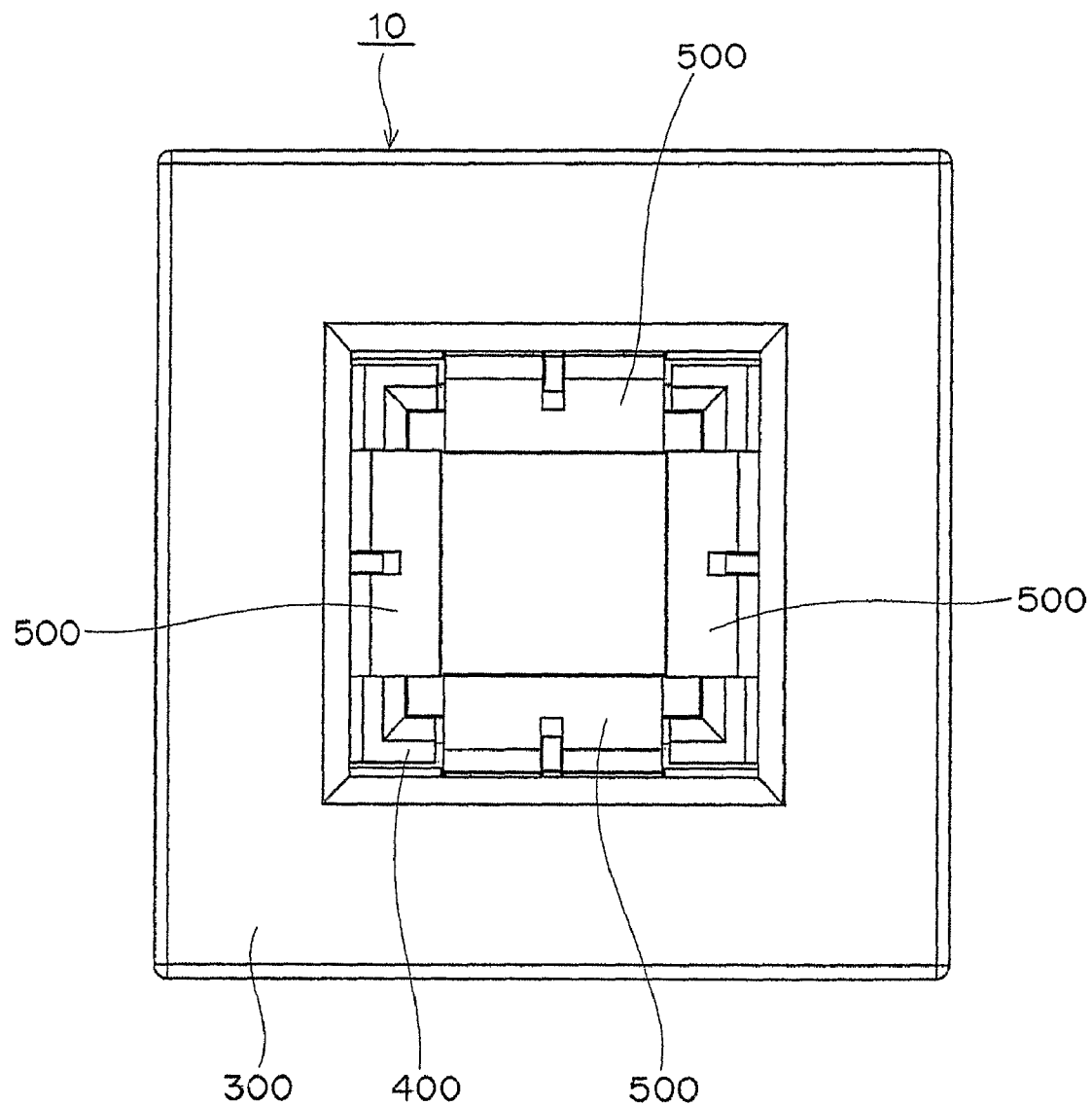
FIG. 13 is a plan view showing another embodiment of the present invention.

Although in the previous embodiment the socket 10 of the previous embodiment has two retainers 500 positioned on opposite sides to oppose to each other across the electronic device, between the lower and upper frames 200 and 300, as shown in FIG. 12, it may have four retainers 500 facing and depressing respective four sides, depending upon the size of the electronic device to be tested.

Also, although in the previous embodiment the contact holder with the electrically connecting means for making electrical contacts with the electronic device is constituted as an individual member separately from the lower frame, it may be integrated with the lower frame into a single member in which the contacts are mounted.

Further, although in the previous embodiment the guide frame is constituted as an individual member separately from the lower frame, it may be integrated with the lower frame into a single member.

The description of the invention is merely exemplary in nature and, thus, variations that do not depart from the gist of the invention are intended to be within the scope of the invention. Such variations are not to be regarded as a departure from the spirit and scope of the invention.

The invention claimed is:

1. A socket for electronic devices each having a plurality of terminals on at least one major surface thereof, comprising:
   a lower frame having a plurality of electrically connecting means, each of the electrically connecting means making an electrical contact with a corresponding terminal of the electronic device;
   an upper frame mounted on the lower frame and assembled with the lower frame so that the upper frame is capable of moving between an elevated position and a lowered position relative to the lower frame; and
   a plurality of retaining means for depressing the electronic device supported by the lower frame to have the terminals of the electronic device contact with the corresponding electrically connecting means, respectively;
   wherein each of the retaining means has
      a first member having a distal portion, a proximal portion and an intermediate portion between the distal and proximal portions;
      a first shaft for pivotably connecting the proximal portion of the first member with the lower frame so that the distal portion of the first member moves between an operative position in which the distal portion of the first member stays on the electronic device supported by the lower frame to make a contact with an upper surface of the electronic device and an inoperative position in which the distal portion of the first member stays away from the electronic device;

a second member having a distal portion and a proximal portion;

a second shaft for pivotably connecting the distal portion of the second member with the intermediate portion of the first member; and a third shaft for pivotably connecting the proximal portion of the second member with the upper frame, wherein both the second and third shafts stay in a horizontal plane or a substantially horizontal plane when the distal portion of the first member takes the operative position.

2. The socket of claim 1 wherein the distal portion of the first member has a flattened portion which is capable of making contact with the upper surface of the electronic device when the distal portion of the first member takes the operative position.

3. The socket of claim 1, wherein the lower frame has a guide frame disposed within an opening defined by the lower frame so that the electronic device is received through the guide frame by the lower frame.

4. A socket for electronic devices each having a plurality of terminals on at least one major surface thereof, comprising:
    a contact holder having a plurality of resiliently deformable contacts arranged corresponding to an arrangement of the terminals of the electronic device and a substrate for holding the resiliently deformable contacts;
    a lower frame surrounding the contact holder;
    an upper frame disposed on the lower frame for movement between an elevated position and a lowered position;
    means for biasing the upper frame into the elevated position; and
    a plurality of means for forcing the electronic device supported by the lower frame downward and retaining the electronic device to make the terminals of the electronic device contact with the corresponding resiliently deformable contacts;
    wherein each of the forcing and retaining means has
        a first member having a distal portion, a proximal portion and an intermediate portion between the distal and proximal portions;
        a first shaft for pivotably connecting the proximal portion of the first member with the lower frame so that the distal portion of the first member moves between an operative position in which the distal portion of the first member stays on the electronic device supported by the lower frame to make a contact with an upper surface of the electronic device and an inoperative position in which the distal portion of the first member stays away from the electronic device;
        a second member having a distal portion and a proximal portion;
        a second shaft for pivotably connecting the distal portion of the second member with the intermediate portion of the first member; and
        a third shaft for pivotably connecting the proximal portion of the second member with the upper frame,
        wherein both the second and third shafts stay in a horizontal plane or a substantially horizontal plane when the distal portion of the first member takes the operative position.

5. The socket of claim 4, wherein the lower frame has a guide frame disposed within an opening defined by the lower frame so that the electronic device is received through the guide frame by the lower frame, the socket further including second biasing means for forcing the guide frame upward relative to the contact holder.

* * * * *